United States Patent
Miyata et al.

(10) Patent No.: US 12,363,997 B2
(45) Date of Patent: Jul. 15, 2025

(54) SEMICONDUCTOR DEVICE

(71) Applicant: DENSO CORPORATION, Kariya (JP)

(72) Inventors: Masanori Miyata, Kariya (JP); Shuji Yoneda, Kariya (JP); Masaru Senoo, Toyota (JP); Yuki Yakushigawa, Toyota (JP)

(73) Assignee: DENSO CORPORATION, Kariya (JP)

( * ) Notice: Subject to any disclaimer, the term of this patent is extended or adjusted under 35 U.S.C. 154(b) by 368 days.

(21) Appl. No.: 17/972,945

(22) Filed: Oct. 25, 2022

(65) Prior Publication Data

US 2023/0037409 A1 Feb. 9, 2023

Related U.S. Application Data

(63) Continuation of application No. PCT/JP2021/016486, filed on Apr. 23, 2021.

(30) Foreign Application Priority Data

Apr. 28, 2020 (JP) .................. 2020-079269

(51) Int. Cl.
*H10D 84/80* (2025.01)
*H10D 8/00* (2025.01)
*H10D 12/00* (2025.01)
*H10D 62/13* (2025.01)

(52) U.S. Cl.
CPC ........... *H10D 84/811* (2025.01); *H10D 8/422* (2025.01); *H10D 12/481* (2025.01); *H10D 62/137* (2025.01)

(58) Field of Classification Search
CPC ............. H01L 27/0664; H01L 29/7397; H01L 29/872; H01L 29/0696; H01L 29/0623; H01L 29/0834; H01L 29/66477; H01L 29/66333; H01L 29/66348; H01L 29/7395; H01L 78
See application file for complete search history.

(56) References Cited

U.S. PATENT DOCUMENTS

| | | |
|---|---|---|
| 2012/0319163 A1 | 12/2012 | Tsuziki et al. |
| 2015/0262999 A1 | 9/2015 | Ogura |
| 2020/0006538 A1 | 1/2020 | Kamibaba et al. |

FOREIGN PATENT DOCUMENTS

| | | |
|---|---|---|
| JP | 2003-303965 A | 10/2003 |
| JP | 2016-086136 A | 5/2016 |

*Primary Examiner* — Tucker J Wright
(74) *Attorney, Agent, or Firm* — Posz Law Group, PLC

(57) ABSTRACT

In a semiconductor device, a semiconductor substrate has an IGBT region and a FWD, and includes a first conductivity type drift layer, a second conductivity type base layer disposed on the drift layer, a second conductivity type collector layer disposed opposite to the base layer with respect to the drift layer in the IGBT region, and a first conductivity type cathode layer disposed opposite to the base layer with respect to the drift layer in the FWD region. The collector layer includes an extension portion that covers only a part of the cathode layer on a side adjacent to the drift layer. Alternatively, the collector layer includes an extension portion that entirely covers a region of the cathode layer adjacent to the drift layer, and has an area density of $3.5 \times 10^{12}$ cm$^{-2}$ or less.

2 Claims, 7 Drawing Sheets

SEMICONDUCTOR DEVICE

CROSS REFERENCE TO RELATED APPLICATIONS

The present application is a continuation application of International Patent Application No. PCT/JP2021/016486 filed on Apr. 23, 2021, which designated the U.S. and claims the benefit of priority from Japanese Patent Application No. 2020-079269 filed on Apr. 28, 2020. The entire disclosures of all of the above applications are incorporated herein by reference.

TECHNICAL FIELD

The present disclosure relates to a semiconductor device in which an insulated gate bipolar transistor (hereinafter, referred to as IGBT) element having an insulated gate structure and a free wheel diode (hereinafter, referred to as FWD) element are formed on a common semiconductor substrate.

BACKGROUND

As a switching element used in inverters and the like, for example, a semiconductor device has been proposed in which an IGBT region having an IGBT element and an FWD region having an FWD element are formed on a common semiconductor substrate.

SUMMARY

The present disclosure describes a semiconductor device having a semiconductor substrate including an IGBT region with an IGBT element and a FWD region with an FWD element. The semiconductor device may have a first conductivity type drift layer, a second conductivity type base layer disposed on the drift layer, a second conductivity type collector layer disposed opposite to the base layer with respect to the drift layer in the IGBT region, and a first conductivity type cathode layer disposed opposite to the base layer with respect to the drift layer in the FWD region. For example, the collector layer may have an extension portion that covers only a part of the cathode layer on a side adjacent to the drift layer. As another example, the collector layer may have an extension portion that entirely covers the cathode layer on a side adjacent to the drift layer, and has an area density of $3.5 \times 10^{12}$ cm$^{-2}$ or less.

BRIEF DESCRIPTION OF DRAWINGS

Features and advantages of the present disclosure will become more apparent from the following detailed description made with reference to the accompanying drawings, in which.

DETAILED DESCRIPTION

Figure 1:
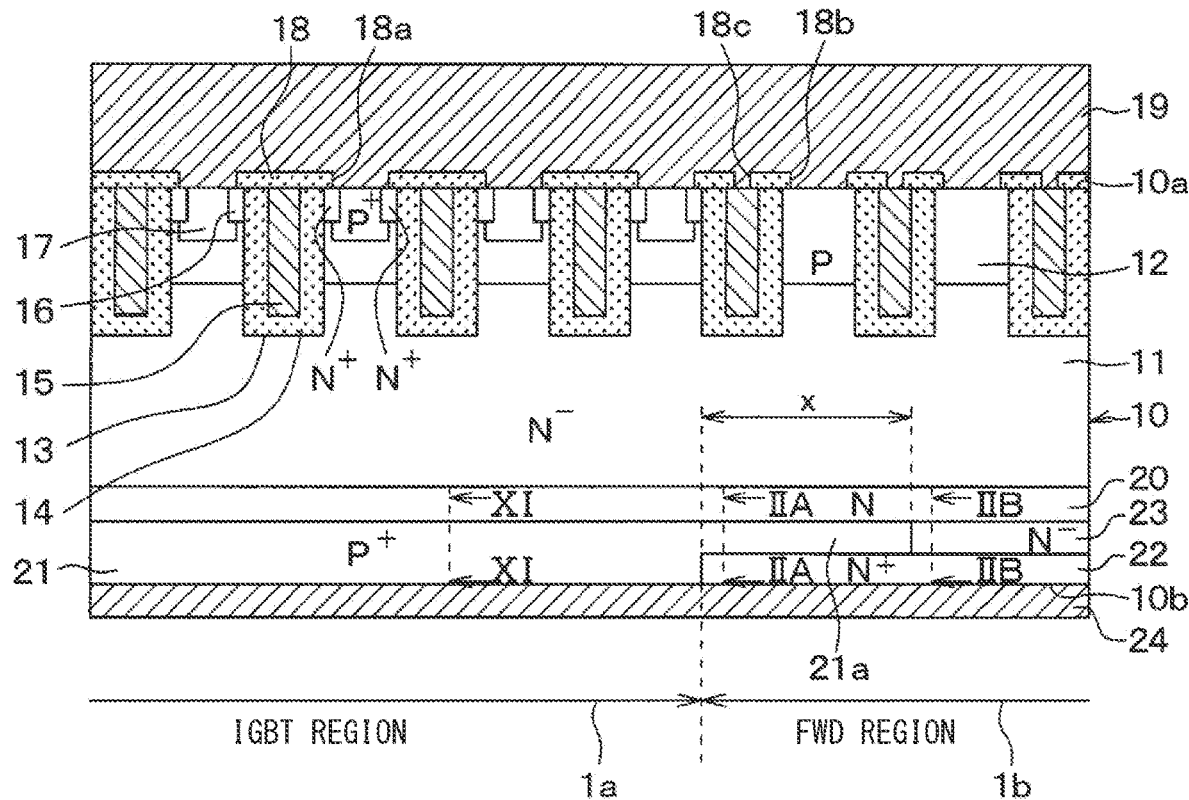
FIG. 1 is a cross-sectional view of a semiconductor device according to a first embodiment.

To begin with, a relevant technology will be described only for understanding the embodiments of the present disclosure.

As a switching element used in inverters and the like, for example, there is a semiconductor device in which an IGBT region having an IGBT element and an FWD region having an FWD element are formed on a common semiconductor substrate. In such a semiconductor device, a base layer may be formed adjacent to a first surface of the semiconductor substrate, which constitutes, for example, an N$^-$-type drift layer, and multiple trenches may be formed so as to penetrate the base layer of the semiconductor substrate. Each of the trenches may extend, as a longitudinal direction, in one direction along a planar direction of the semiconductor substrate, as a longitudinal direction. In each trench, a gate insulating film and a gate electrode may be disposed in a stated order.

An N$^+$-type emitter region may be formed in a surface layer portion of the base layer so as to be in contact with the trench. A P$^+$-type collector layer and an N$^+$-type cathode layer may be formed adjacent to a second surface of the semiconductor substrate. Further, on a side adjacent to the second surface of the semiconductor substrate, a P$^+$-type shield layer may be formed entirely in a region between the drift layer and the collector layer and the cathode layer. In other words, a region of the cathode layer adjacent to the drift layer may be entirely covered with the shield layer. In addition, an upper electrode may be formed adjacent to the first surface of the semiconductor substrate, and electrically connected to the emitter region and the base layer. A lower electrode may be formed adjacent to the second surface of the semiconductor substrate, and electrically connected to the collector layer and the cathode layer.

In such a semiconductor device, a region where the collector layer is formed may serve as the IGBT region, and a region where the cathode layer is formed may serve as the FWD region. In the FWD region, due to the configuration described above, an FWD element having a PN junction may be provided by the N-type cathode layer, the N-type drift layer, and the P-type base layer.

In such a semiconductor device, when the IGBT element is in an on state, electrons are supplied from the emitter region to the drift layer and holes are supplied from the collector layer to the drift layer. In this case, since the region of the cathode layer adjacent to the drift layer is entirely covered with the shield layer, snapback in the IGBT element can be suppressed.

However, since the region of the cathode layer adjacent to the drift layer is entirely covered with the shield layer, when the FWD element is turned on and operates as a diode, electrons supplied from the cathode layer may be difficult to flow toward the base layer because of the shield layer. That is, in the semiconductor device described above, the forward voltage of the FWD element may increase.

The present disclosure provides a semiconductor device capable of suppressing an increase in the forward voltage of the FWD element while suppressing snapback of the IGBT element.

According to an aspect of the present disclosure, a semiconductor device includes a semiconductor substrate having an insulated gate bipolar transistor (IGBT) region with an IGBT element and a free wheel diode (FWD) region with a FWD element. The semiconductor substrate includes: a drift layer of a first conductivity type; a base layer of a second conductivity type disposed on the drift layer; a collector layer of the second conductivity type disposed opposite to the base layer with respect to the drift layer in the IGBT region; and a cathode layer of the first conductivity type disposed opposite to the base layer with respect to the drift layer in the FWD region. The semiconductor substrate has a first surface adjacent to the base layer and a second surface adjacent to the collector layer and the cathode layer. The semiconductor device further includes: an emitter region of a first conductivity type disposed in a surface layer portion of the base layer in the IGBT region; a gate insulating film disposed in a portion of the base layer between the drift layer and the emitter region in the IGBT region; a gate electrode disposed on the gate insulating film; a first electrode disposed adjacent to the first surface of the semiconductor substrate and electrically connected to the base layer and the emitter region; and a second electrode disposed adjacent to the second surface of the semiconductor substrate and electrically connected to the collector layer and the cathode layer. The collector layer includes an extension portion that covers only a part of a region of the cathode layer adjacent to the drift layer.

In such a configuration, since the extension portion is provided on the cathode layer adjacent to the drift layer, it is possible to suppress snapback when the IGBT element is turned on. In addition, the extension portion is arranged so as to cover only a part of the cathode layer on the drift layer side. Therefore, when the FWD element is in an on state, movement of carriers (e.g., electrons) from the cathode layer to the base layer will not be hampered, and an increase in forward voltage of the FWD element can be suppressed.

According to an aspect of the present disclosure, a semiconductor device includes a semiconductor substrate having an insulated gate bipolar transistor (IGBT) region with an IGBT element and a free wheel diode (FWD) region with a FWD element. The semiconductor substrate includes: a drift layer of a first conductivity type; a base layer of a second conductivity type disposed on the drift layer; a collector layer of the second conductivity type disposed opposite to the base layer with respect to the drift layer in the IGBT region; and a cathode layer of the first conductivity type disposed opposite to the base layer with respect to the drift layer in the FWD region. The semiconductor substrate has a first surface adjacent to the base layer and a second surface adjacent to the collector layer and the cathode layer. The semiconductor device further includes: an emitter region of a first conductivity type disposed in a surface layer portion of the base layer in the IGBT region; a gate insulating film disposed in a portion of the base layer between the drift layer and the emitter region in the IGBT region; a gate electrode disposed on the gate insulating film; a first electrode disposed adjacent to the first surface of the semiconductor substrate and electrically connected to the base layer and the emitter region; and a second electrode disposed adjacent to the second surface of the semiconductor substrate and electrically connected to the collector layer and the cathode layer. The collector layer includes an extension portion that entirely covers a region of the cathode layer adjacent to the drift layer. The extension portion has an area density of $3.5 \times 10^{12}$ cm$^{-2}$ or less.

In such a configuration, since the extension portion is provided on the cathode layer adjacent to the drift layer, it is possible to suppress snapback when the IGBT element is turned on. The extension portion has the area density of $3.5 \times 10^{12}$ cm$^{-2}$ or less. Therefore, an increase in the forward voltage of the FWD element can be suppressed.

Embodiments of the present disclosure will be described hereinafter with reference to the drawings. In the embodiments described hereinafter, the same or equivalent parts are designated with the same reference numbers.

First Embodiment

A first embodiment will be described with reference to the drawings. For example, a semiconductor device of the present embodiment is used as a power switching element of a power supply circuit such as an inverter or a DC-to-DC converter.

As shown in FIG. 1, the semiconductor device of the present embodiment has a reverse conducting (RC)-IGBT in which an IGBT region 1a having an IGBT element and an FWD region 1b having an FWD element are formed in the same semiconductor substrate 10. Although details will be described later, a collector layer 21 and a cathode layer 22 are disposed adjacent to a second surface 10b of the semiconductor substrate 10. In the present embodiment, a region above the collector layer 21 serves as the IGBT region 1a, and a region above the cathode layer 22 serves as the FWD region 1b.

The semiconductor device has the semiconductor substrate 10 forming an N$^-$-type drift layer 11. In the present embodiment, the semiconductor substrate 10 is provided by a silicon substrate, and has a thickness of about 127 micrometres (μm). A base layer 12 is disposed on the drift layer 11. In other words, the base layer 12 is disposed adjacent to a first surface 10a of the semiconductor substrate 10.

Multiple trenches 13 are provided in the semiconductor substrate 10 so as to penetrate the base layer 12 from the first surface 10a side and reach the drift layer 11. Accordingly, the base layer 12 is divided into multiple sections by the trenches 13. In the present embodiment, the multiple trenches 13 are disposed in both of the IGBT region 1a and the FWD region 1*b*. The multiple trenches 13 are formed into a stripe pattern with one direction intersecting an arrangement direction of the IGBT region 1*a* and the FWD region 1*b* as a longitudinal direction. That is, the arrangement direction of the IGBT region 1*a* and the FWD region 1*b* corresponds to a left and right direction in FIG. 1, and the direction intersecting the arrangement direction corresponds to a direction intersecting the paper surface of FIG. 1.

Each of the trenches 13 is filled with a gate insulating film 14 disposed so as to cover a wall surface of the trench 13, and a gate electrode 15 disposed on the gate insulating film 14. The gate electrode 15 is made of polysilicon or the like. Accordingly, a trench gate structure is formed.

Although not particularly shown, the gate electrode 15 provided in the IGBT region 1*a* is connected to a gate driver or the like via a gate pad or the like (not shown), so that the gate electrode 15 is applied with a predetermined voltage. The gate electrode 15 provided in the FWD region 1*b* is connected to an upper electrode 19, which will be described later, so that the gate electrode 15 has the same potential as the upper electrode 19.

An N$^+$-type emitter region 16 having a higher carrier concentration than the drift layer 11 is disposed in a surface layer portion of the base layer 12 in the IGBT region 1*a*. That is, the emitter region 16 is disposed adjacent to the first surface 10*a* of the semiconductor substrate 10 in the IGBT region 1*a*. A P$^+$-type contact region 17 having a higher carrier concentration than the base layer 12 is disposed in the surface layer portion of the base layer 12 in the IGBT region 1*a*. Specifically, the emitter region 16 is disposed so as to terminate in the base layer 12 and to be in contact with a side surface of the trench 13. The contact region 17 is disposed so as to terminate in the base layer 12 and is interposed between two emitter regions 16.

More specifically, the emitter regions 16 extend in a bar shape along the longitudinal direction of the trenches 13 so as to be in contact with the side surfaces of the trenches 13 in regions between adjacent two trenches 13, and terminate at position more to inside than the ends of the trenches 13. Further, the contact regions 17 extends in a bar shape along the longitudinal direction of the trenches 13 so as to be in contact with the emitter regions 16.

In the present embodiment, a portion of the wall surface of each of the trenches 13 located between the emitter region 16 and the drift layer 11 corresponds to a surface of the base layer 12 located between the emitter region 16 and the drift layer 11. Further, in the present embodiment, the contact region 17 is disposed to be deeper than the emitter region 16.

An interlayer insulating film 18 is disposed on the first surface 10*a* of the semiconductor substrate 10. The interlayer insulating film 18 is made of borophosphosilicate glass (BPSG) or the like. The interlayer insulating film 18 is formed with a contact hole 18*a* to expose the emitter regions 16 and the contact region 17 located between the adjacent trenches 13 on the first surface 10*a* of the semiconductor substrate 10 in the IGBT region 1*a*. Further, the interlayer insulating film 18 is formed with a contact hole 18*b* to expose the base layer 12 and a contact hole 18*c* to expose the gate electrode 15 on the first surface 10*a* of the semiconductor substrate 10 in the FWD region 1*b*.

The upper electrode 19 is disposed on the interlayer insulation film 18. In the IGBT region 1*a*, the upper electrode 19 is electrically connected to the emitter regions 16 and the contact region 17 through the contact hole 18*a* formed in the interlayer insulating film 18. In the FWD region 1*b*, the upper electrode 19 is electrically connected to the base layer 12 through the contact hole 18*b* formed in the interlayer insulating film 18. The upper electrode 19 is also electrically connected to the gate electrode 15 through the contact hole 18*c* formed in the interlayer insulating film 18.

That is, the upper electrode 19 is disposed on the interlayer insulating film 18, and the upper electrode 19 functions as an emitter electrode in the IGBT region 1*a* and functions as an anode electrode in the FWD region 1*b*. In the present embodiment, the upper electrode 19 corresponds to a first electrode.

An N-type field stop layer (hereinafter referred to as an FS layer) 20 having a carrier concentration higher than that of the drift layer 11 is disposed opposite to the base layer 12 with respect to the drift layer 11. That is, the FS layer 20 is formed on a side adjacent to the second surface 10*b* of the semiconductor substrate 10.

In the IGBT region 1*a*, a P$^+$-type collector layer 21 is disposed opposite to the drift layer 11 with respect to the FS layer 20. In the FWD region 1*b*, an N$^+$-type cathode layer 22 is disposed opposite to the drift layer 11 with respect to the FS layer 20.

In the present embodiment, the collector layer 21 is deeper than the cathode layer 22 with reference to the second surface 10*b* of the semiconductor substrate 10. That is, the depth of the collector layer 21 is greater than the depth of the cathode layer 22, from the second surface 10*b* of the semiconductor substrate 10. The collector layer 21 has an extension portion 21*a* extending to a position above the cathode layer 22. That is, the collector layer 21 has the extension portion 21*a* covering a portion of the cathode layer 22 adjacent to the drift layer 11. In the present embodiment, however, the extension portion 21*a* is formed not to cover an entire region above the cathode layer 22, so that a part of a surface of the cathode layer 22 adjacent to the drift layer 11 is exposed from, that is, not covered with the extension portion 21*a*, the part being opposite to the collector layer 21 in the planar direction. In the following description, the length of the extension portion 21*a* along the arrangement direction of the collector layer 21 and the cathode layer 22 is defined as the length x of the extension portion 21*a*.

An N$^-$-type connection region 23 is disposed between the part of the cathode layer 22 exposed from the extension portion 21*a* and the FS layer 20. In the present embodiment, the connection region 23 has a lower carrier concentration than the cathode layer 22 and has the same carrier concentration as the drift layer 11. More specifically, the connection region 23 is provided by a portion of the drift layer 11.

The FS layer 20, the collector layer 21, the cathode layer 22, and the connection region 23 as described above are formed, for example, as follows. That is, after ion-implanting impurities for forming the FS layer 20, impurities for forming the collector layer 21 including the extension portion 21*a* are ion-implanted. Thereafter, impurities for forming the cathode layer 22 are ion-implanted between the portion for forming the extension portion 21*a* and the second surface 10*b* of the semiconductor substrate 10, and then a heat treatment is performed.

Figure 2A:
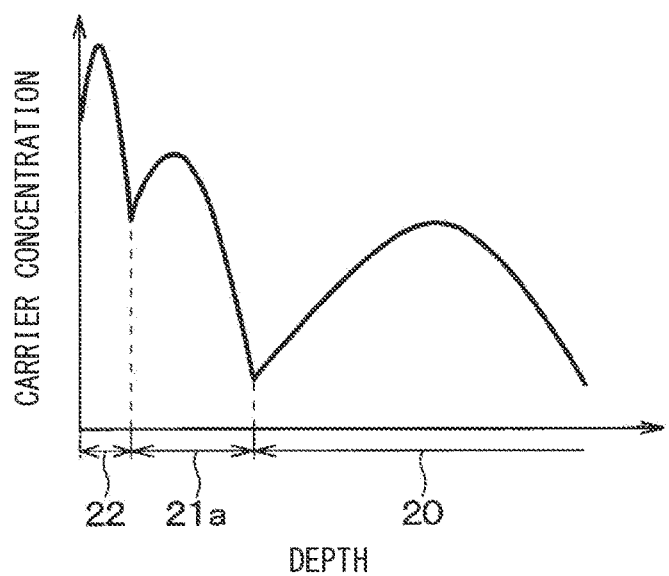
FIG. 2A is a diagram showing a relationship between a depth and a carrier concentration along a line IIA-IIA in FIG. 1.
Figure 2B:
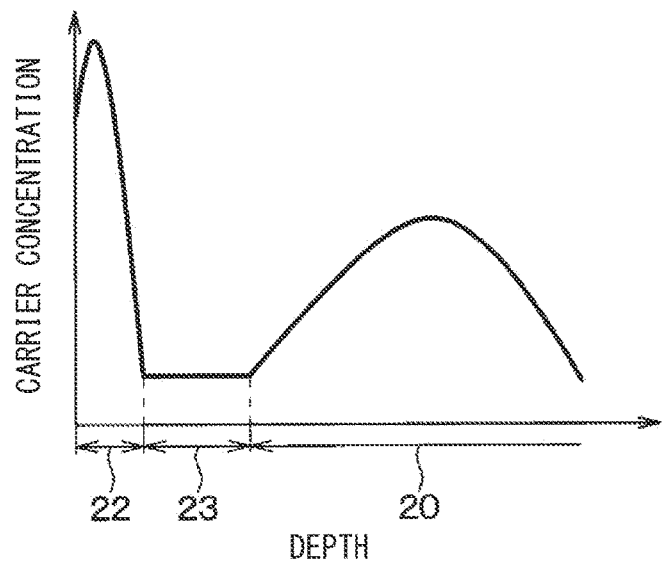
FIG. 2B is a diagram showing the relationship between the depth and the carrier concentration along a line IIB-IIB in FIG. 1.

Since the FS layer 20, the collector layer 21, and the cathode layer 22 are formed by ion-implanting the impurities and performing the heat-treatment as described above, the carrier concentration thereof has a normal distribution, as shown in FIGS. 2A and 2B. The connection region 23 of the present embodiment has a constant carrier concentration since the connection region 23 is provided by the portion of the drift layer 11.

As shown in FIG. 1, on the second surface 10*b* of the semiconductor substrate 10, the collector layer 21 and the cathode layer 22 are disposed adjacent to each other. In the present embodiment, the IGBT region 1a and the FWD region 1b are partitioned depending on whether the layer located on the second surface 10b of the semiconductor substrate 10 is the collector layer 21 or the cathode layer 22. That is, in the present embodiment, the region above the collector layer 21, which is at the second surface 10b of the semiconductor substrate 10, serves as the IGBT region 1a, and the region above the cathode layer 22, which is at the second surface 10b of the semiconductor substrate 10, serves as the FWD region 1b. In the present embodiment, therefore, it can be said that the extension portion 21a is disposed in the FWD region 1b.

A lower electrode 24 is disposed opposite to the drift layer 11 with respect to the collector layer 21 and the cathode layer 22. The lower electrode 24 is electrically connected to the collector layer 21 and the cathode layer 22. In other words, the lower electrode 24 is formed on the second surface 10b of the semiconductor substrate 10. That is, the lower electrode 24 that functions as a collector electrode in the IGBT region 1a and a cathode electrode in the FWD region 1b is provided. In the present embodiment, the lower electrode 24 corresponds to a second electrode.

The semiconductor device of the present embodiment is configured as described above, and thus forms the IGBT element in the IGBT region 1a. The IGBT element includes a base provided by the base layer 12, an emitter provided by the emitter region 16 and a collector provided by the collector layer 21. In the FWD region 1b, a PN-junction FWD element is formed. The PN-junction FWD element includes an anode provided by the base layer 12, and a cathode provided by the drift layer 11, the FS layer 20, the cathode layer 22 and the connection region 23

The configuration of the semiconductor device according to the present embodiment has been described above. In the present embodiment, the N-type, the $N^+$-type, and the $N^-$-type correspond to a first conductivity type, and the P-type and the $P^+$-type correspond to a second conductivity type. Since the semiconductor device of the present embodiment is configured as described above, the semiconductor substrate 10 includes the collector layer 21, the cathode layer 22, the connection region 23, the FS layer 20, the drift layer 11, the base layer 12, the emitter regions 16, and the contact region 17.

Next, operations and effects of the semiconductor device described hereinabove will be described. First, a basic operation of the semiconductor device will be described.

In the semiconductor device, when the lower electrode 24 is applied with a voltage higher than a voltage applied to the upper electrode 19, the PN junction between the base layer 12 and the drift layer 11 is brought into a reverse conduction state to form a depletion layer. When the gate electrode 15 is applied with a low-level voltage (for example, 0 V) that is lower than a threshold voltage Vth of the insulated gate structure, a current does not flow between the upper electrode 19 and the lower electrode 24.

To turn on the IGBT element, a high-level voltage equal to or higher than the threshold voltage Vth of the insulated gate structure is applied to the gate electrode 15 of the IGBT region 1a in a state where the lower electrode 24 is applied with the voltage higher than that of the upper electrode 19. As a result, in the IGBT region 1a, an inversion layer is formed in a portion of the base layer 12 that is in contact with the trench 13 in which the gate electrode 15 is arranged. When the holes are supplied from the collector layer 21 to the drift layer 11 as the electrons are supplied from the emitter region 16 to the drift layer 11 through the inversion layer, the resistance value of the drift layer 11 is decreased due to conductivity modulation, and thus the IGBT element is turned to an on state.

To turn off the IGBT element and to turn on the FWD element, (i.e., to operate the FWD element as a diode), the voltages to be applied to the upper electrode 19 and the lower electrode 24 are switched, and the upper electrode 19 is applied with the higher voltage than that applied to the lower electrode 24, so a forward voltage application is performed. As a result, the FWD element operates as a diode because holes are supplied to the base layer 12 and electrons are supplied to the cathode layer 22.

Figure 3:
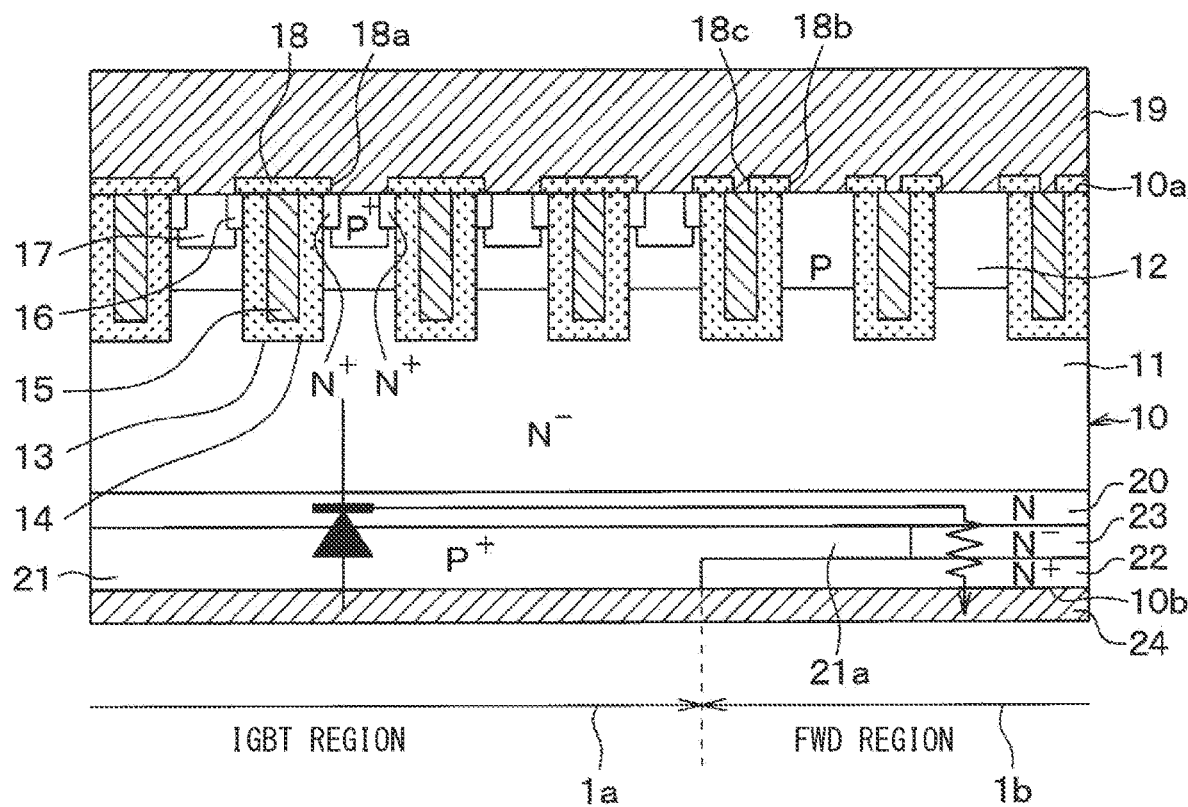
FIG. 3 is a schematic diagram showing the flow of electrons when the IGBT element is in an on state.
Figure 4A:
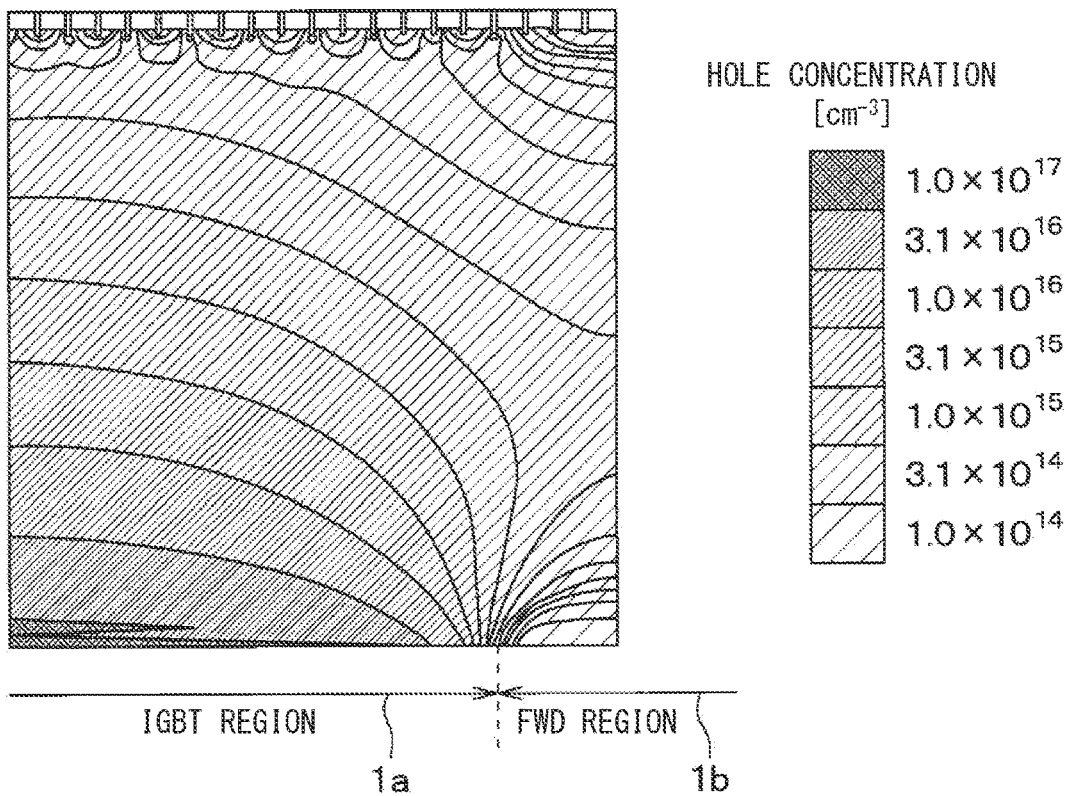
FIG. 4A is a diagram showing a simulation result regarding a hole concentration when the IGBT element is in the on state, in a configuration without having an extension portion.
Figure 4B:
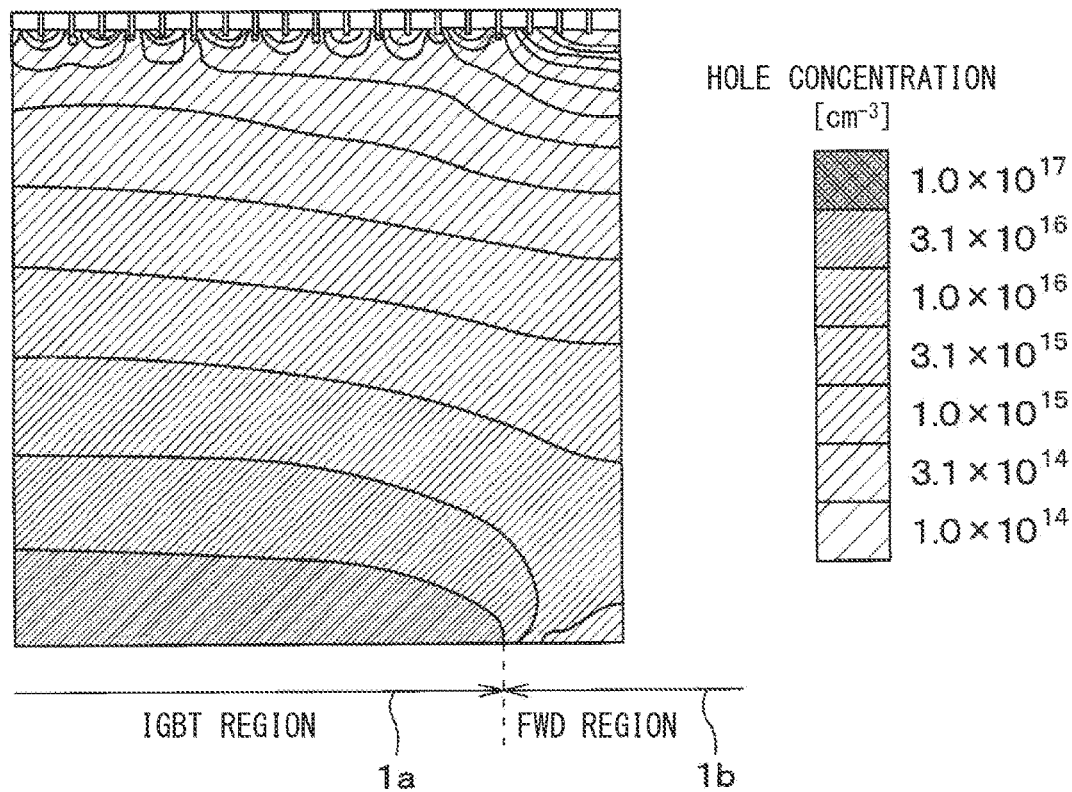
FIG. 4B is a diagram showing a simulation result regarding a hole concentration when the IGBT element is in an on state, in a configuration having an extension portion.

The basic operation of the semiconductor device of the present embodiment is described hereinabove. In the present embodiment, the extension portion 21a is disposed on the cathode layer 22. Therefore, when the IGBT element is turned on, or when the IGBT element is in the on state, as shown in FIG. 3, electrons reach the portion of the FS layer 20 located in the IGBT region 1a, and then move toward the FWD region 1b along the planar direction of the semiconductor substrate 10. The electrons are then discharged from the cathode layer 22. The holes supplied from the collector layer 21 to the drift layer 11 are supplied also from the extension portion 21a to the drift layer 11. Therefore, as shown in FIGS. 4A and 4B, in the configuration in which the extension portion 21a is arranged on the cathode layer 22, it is confirmed that the hole concentration at the boundary between the IGBT region 1a and the FWD region 1b is high, as compared with the configuration in which the extension portion 21a is not arranged on the cathode layer 22.

It is assumed that a dimension of the cathode layer 22 along the arrangement direction of the IGBT region 1a and the FWD region 1b is referred to as a width of the cathode layer 22. FIG. 4B is a simulation result of the configuration in which the length x of the extension portion 21a is the same as the width of the cathode layer 22. That is, FIG. 4B is the simulation result of the configuration in which the extension portion 21a is arranged so as to cover the entire region above the cathode layer 22, that is, entirely cover the surface of the cathode layer 22 adjacent to the drift layer 11. However, even if the extension portion 21a is arranged not to cover the entire region above the cathode layer 22 as in the present embodiment, the holes can be supplied to the drift layer 11 also from the extension portion 21a. Therefore, the hole concentration at the boundary between the region 1a and the FWD region 1b can be increased.

Figure 5A:
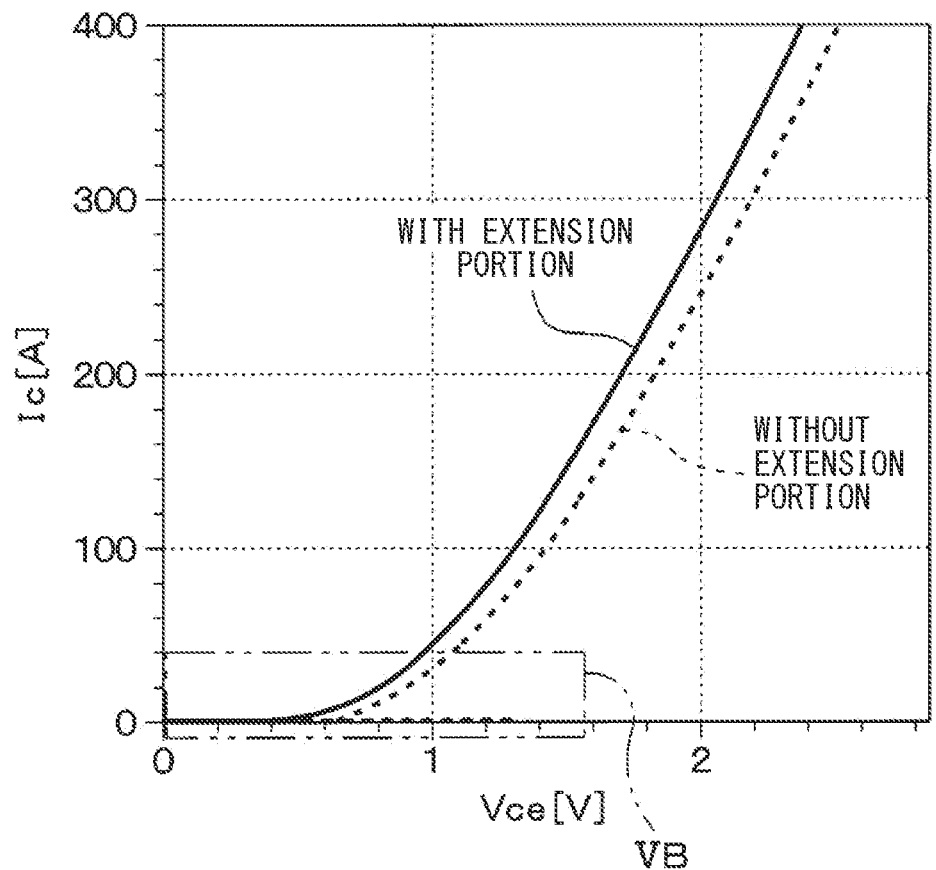
FIG. 5A is a diagram showing a simulation result regarding a relationship between a collector-emitter voltage and a collector current.
Figure 5B:
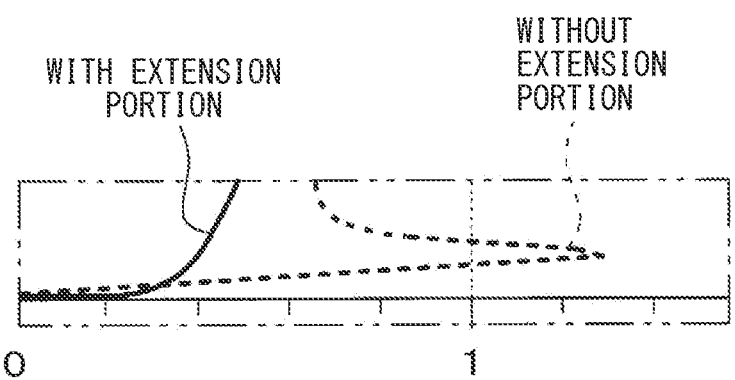
FIG. 5B is an enlarged view of a part VB surrounded by a two-dot chain line in FIG. 5A.

Further, it is confirmed that an occurrence of snapback can be suppressed when the extension portion 21a is arranged to cover the entire region above the cathode layer 22, as shown in FIGS. 5A and 5B. In FIGS. 5A and 5B, a solid line represents the simulation result of the configuration in which the extension portion 21a is arranged so as to cover the entire region above the cathode layer 22. However, even if the extension portion 21a is arranged not to cover the entire region above the cathode layer 22 as in the present embodiment, since the hole concentration at the boundary between the IGBT region 1a and the FWD region 1b can be increased, it is possible to suppress the occurrence of snapback.

On the other hand, in the configuration where the extension portion 21a is arranged so as to cover the entire region above the cathode layer 22, when the FWD element is turned on, electrons are less likely to move from the cathode layer 22 toward the base layer 12. Therefore, in the configuration where the extension portion 21a is arranged so as to cover the entire region above the cathode layer 22, the forward voltage of the FWD element is increased, as shown in FIG.

Figure 6:
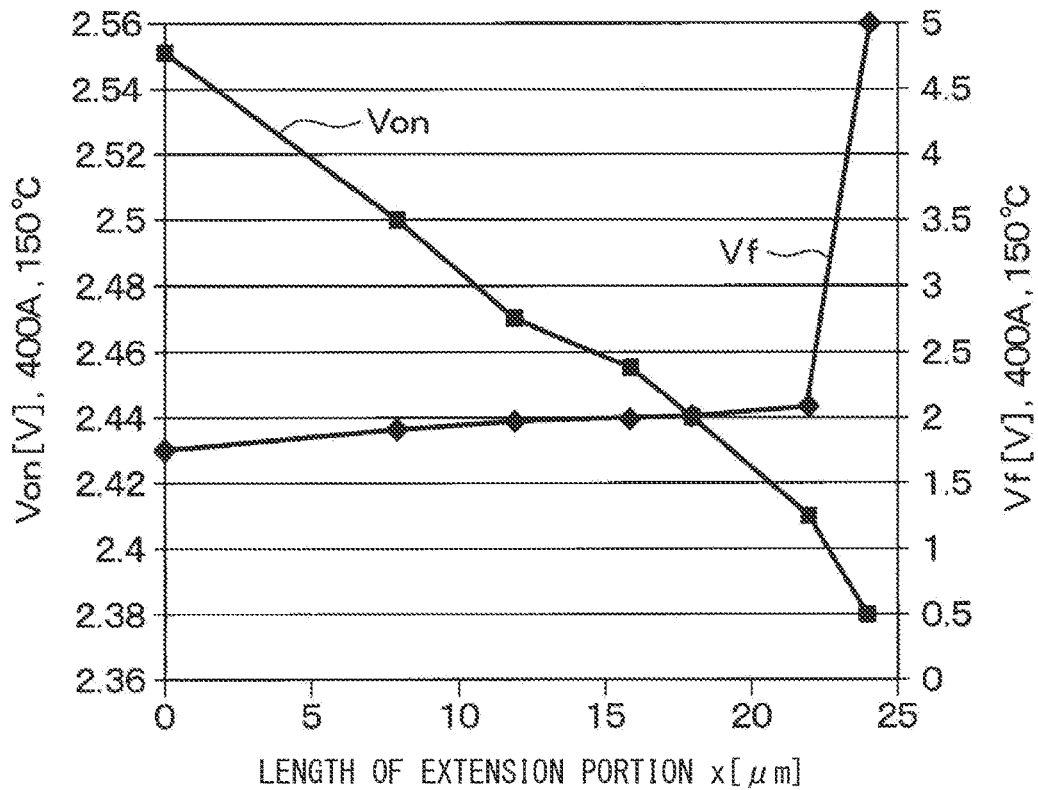
FIG. 6 is a diagram showing a simulation result regarding a relationship between a length of the extension portion and an on voltage of the IGBT element and a forward voltage of a FWD element.

6. FIG. 6 shows a simulation result of the configuration in which the width of the cathode layer 22 is 24 μm. When the length of the extension portion 21a is 24 μm, the extension portion 21a entirely covers the region above the cathode layer 22.

In the present embodiment, as described above, the extension portion 21a is formed not to cover the entire region above the cathode layer 22, and the part of the cathode layer 22 is exposed from the extension portion 21a. That is, the length x of the extension portion 21a is less than 24 μm. Therefore, as shown in FIG. 6, it is possible to restrict the forward voltage of the FWD element from increasing.

Note that FIG. 6 shows the simulation result when a current of 400 A is applied at 150° C. In FIG. 6, Von represents the on-voltage, and Vf represents the forward voltage. As shown in FIG. 6, the on-voltage decreases with an increase in the length x of the extension portion 21a. For this reason, it is preferable that the cathode layer 22 is partly exposed from the extension portion 21a and the length x of the extension portion 21a is set according to the required on-voltage or the like. For example, in the present embodiment, when the length x is 23 μm, it is possible to sufficiently reduce the on-voltage while suppressing an increase in the forward voltage. That is, when the ratio of the length x of the extension portion 21a to the width of the cathode layer 22 is 23/24, it is possible to sufficiently reduce the on-voltage while suppressing the increase in the forward voltage.

In the present embodiment, the carrier concentration of the connection region 23 between the FS layer 20 and the cathode layer 22 is lower than that of the cathode layer 22. Therefore, the voltage applied to the PN junction between the collector layer 21 and the FS layer 20 can be increased, as compared to a configuration where the part of the cathode layer 22 exposed from the extension portion 21a is connected to the FS layer 20. Therefore, when the IGBT element is in the on state, the holes supplied to the collector layer 21 can be increased, and it is possible to suppress the on-voltage from rising due to the extension portion 21a being arranged not to cover the entire region above the cathode layer 22.

In the present embodiment described above, the extension portion 21a is formed so as to partially cover the cathode layer 22. Therefore, it is possible to suppress snapback when the IGBT element is turned on. Further, the cathode layer 22 has the part exposed from the extension portion 21a. Therefore, when the FWD element is in the on state, it is possible to suppress the electrons from being hampered to move from the cathode layer 22 toward the base layer 12. Thus, the increase in the forward voltage can be suppressed.

In the present embodiment, the connection region 23 having the carrier concentration lower than that of the cathode layer 22 is arranged between the FS layer 20 and the cathode layer 22. Therefore, for example, as compared to the configuration where the part of the cathode layer 22 exposed from the extension portion 21a is connected to the FS layer 20, the voltage applied to the PN junction between the collector layer 21 and the FS layer 20 can be increased. Therefore, when the IGBT element is in the on state, the holes supplied to the collector layer 21 can be increased. It is possible to suppress the on-voltage from increasing due to the extension portion 21a being arranged not to cover the entire region above the cathode layer 22.

Second Embodiment

A second embodiment will be described. In the present embodiment, the configuration of the extending portion 21a is changed from that of the first embodiment. The other configurations are the same as those of the first embodiment, and therefore a description of the same configurations will be omitted hereinafter.

Figure 7:
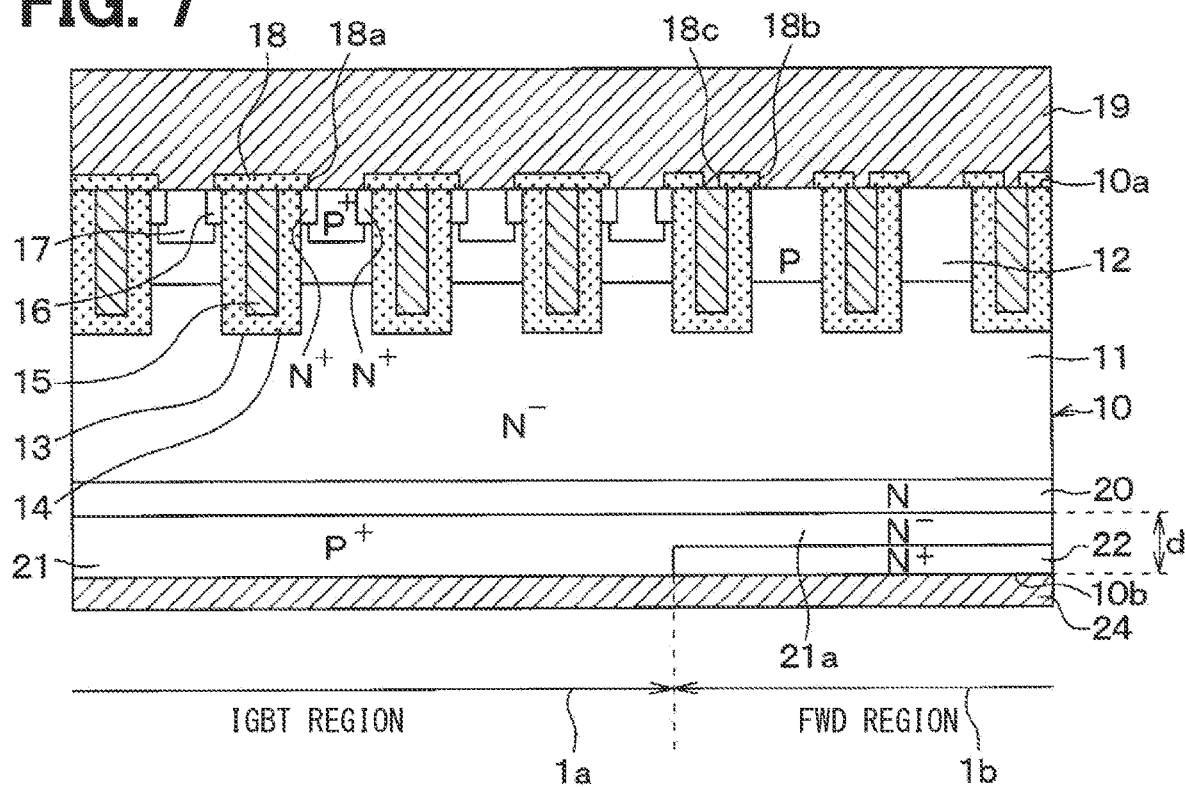
FIG. 7 is a cross-sectional view of a semiconductor device according to a second embodiment.
Figure 8:
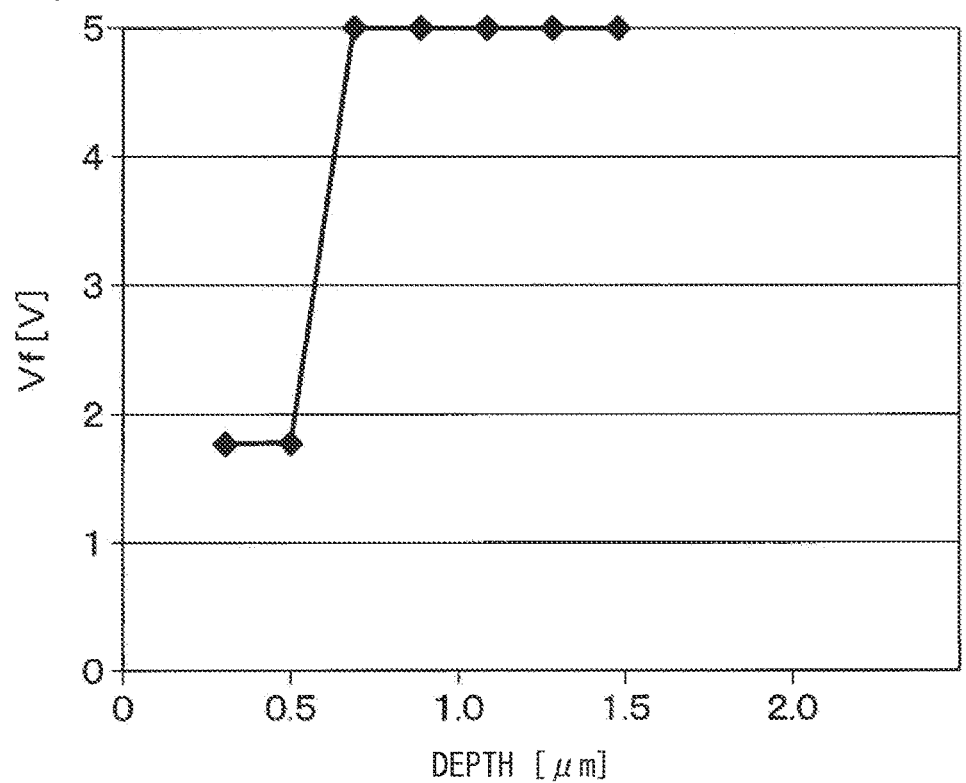
FIG. 8 is a diagram showing a simulation result regarding a relationship between a depth of a collector layer and a forward voltage of a FWD element, in a case where the carrier concentration of the collector layer is constant.
Figure 9:
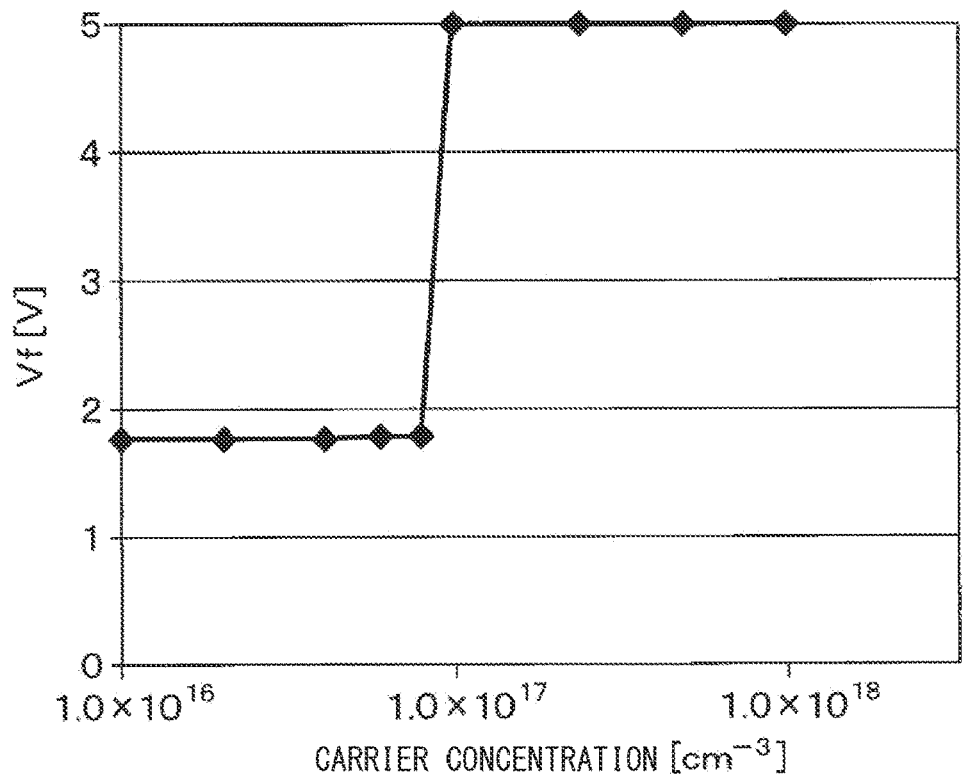
FIG. 9 is a diagram showing a simulation result regarding a relationship between a carrier concentration of the collector layer and the forward voltage of the FWD element, in a case where the depth of the collector layer is constant.
Figure 10:
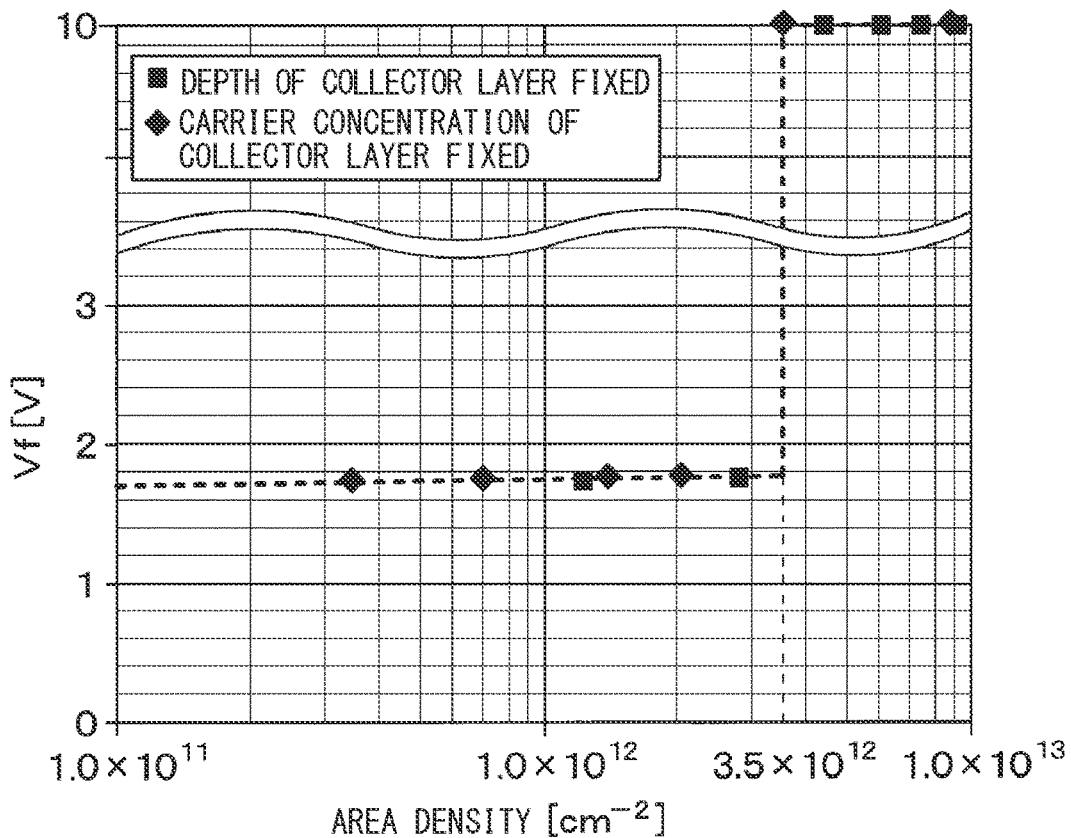
FIG. 10 is a diagram showing a relationship between an area density and a forward voltage of the FWD element.

In the semiconductor device of the present embodiment, as shown in FIG. 7, the extension portion 21a is arranged so as to cover the entire region above the cathode layer 22. That is, the cathode layer 22 is in a state where the surface adjacent to the drift layer 11 is entirely covered with the extension portion 21a. Therefore, in the semiconductor device of the present embodiment, the forward voltage of the FWD element may increase as described above. For this reason, in the semiconductor device of the present embodiment, the extension portion 21a is configured as follows. The configuration of the extension portion 21a of the present embodiment will be described hereinafter with reference to FIGS. 8 to 10. Note that, in FIGS. 8 to 10, the depth of the cathode layer 22, from the second surface 10b of the semiconductor substrate 10 as a reference of the depth, is set to 0.15 μm. As shown in FIG. 7, the depth of the collector layer 21, from the second surface 10b of the semiconductor substrate 10 as the reference, is defined as d. In FIGS. 8 to 10, Vf represents the forward voltage of the FWD element.

First, as shown in FIG. 8, in a case where the carrier concentration of the collector layer 21 is fixed at $1.0\times10^{18}$ cm$^{-3}$, it is confirmed that the forward voltage of the FWD element sharply increases when the depth d of the collector layer 21 is 0.5 μm or more. Further, as shown in FIG. 9, in a case where the depth d of the collector layer 21 is fixed at 0.5 μm, it is confirmed that the forward voltage of the FWD element sharply increases when the carrier concentration of the collector layer 21 is $1.0\times10^{17}$ cm$^{-3}$ or more. FIGS. 8 and 9 are simulation results when the carrier concentration is constant along the depth direction.

By deriving the area density of the extension portion 21a based on FIGS. 8 and 9, the area density and the forward voltage of the FWD element have the relationship shown in FIG. 10. That is, as shown in FIG. 10, the forward voltage sharply increases when the area density exceeds $3.5\times10^{12}$ cm$^{-2}$. In the present embodiment, therefore, the area density of the extension portion 21a is $3.5\times10^{12}$ cm$^{-2}$ or less.

According to the present embodiment described above, the extension portion 21a is arranged over the entire region on the cathode layer 22. Therefore, it is possible to suppress the snapback when the IGBT element is turned on. Further, the extension portion 21a has the area density of $3.5\times10^{12}$ cm$^{-2}$ or less. Therefore, it is possible to suppress an increase in the forward voltage of the FWD element.

Third Embodiment

A third embodiment will be described. In the present embodiment, the peak position of the carrier concentration of the collector layer 21 is defined as compared to the first embodiment. The other configurations are the same as those of the first embodiment, and therefore a description of the same configurations will be omitted below.

Figure 11:
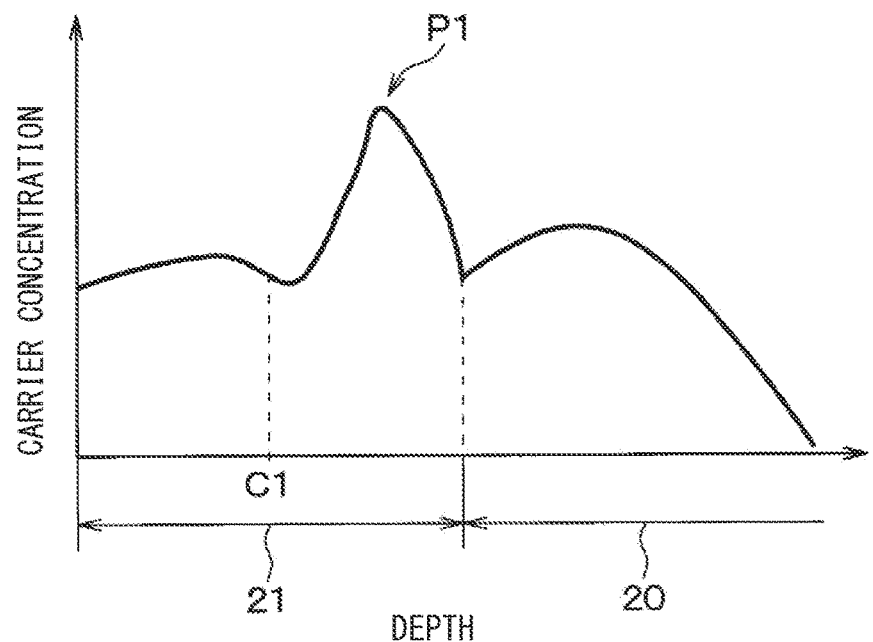
FIG. 11 is a diagram showing a relationship between a depth and a carrier concentration along a line XI-XI in FIG. 1 according to a third embodiment.

The basic configuration of the semiconductor device of the present embodiment is the same as that of the first embodiment, but the collector layer 21 is configured to have multiple peaks in the carrier concentration, as shown in FIG. 11. The collector layer 21 is disposed such that the maximum peak position P1 at which the carrier concentration is maximum is positioned closer to the drift layer 11 (that is, closer to the FS layer 20) than the center C1 of the collector layer 21 in the depth direction of the semiconductor substrate 10.

Such a collector layer 21 is formed by, for example, performing ion-implantations multiple times with different acceleration voltages.

According to the present embodiment described above, the maximum peak position P1 of the collector layer 21 is located closer to the drift layer 11 than the center C1. Therefore, an occurrence of avalanche breakdown can be suppressed, and the short circuit safe operating area (SC-SOA) can be improved.

That is, when the semiconductor device as described above is short-circuited, since the amount of electrons is excessive due to the hole injection being reduced, the electric field intensity has a peak on the second surface 10b side of the semiconductor substrate 10. In the present embodiment, since the FS layer 20 is provided, the peak occurs in the FS layer 20. In the semiconductor device, if the electric field intensity has the peak on the lower electrode 24 side, the avalanche breakdown is likely to occur.

In the present embodiment, however, the maximum peak position P1 of the carrier concentration of the collector layer 21 is set to be adjacent to the drift layer 11. For this reason, for example, as compared to the configuration where the maximum peak position P1 is located closer to the second surface 10b of the semiconductor substrate 10 than the center C1, the amount of holes injected into a position at which the electric field intensity has the peak is easily increased during the short circuit, and the electron excessive state can be alleviated. Therefore, it is possible to suppress the occurrence of avalanche breakdown.

Other Embodiments

Although the present disclosure has been described in accordance with the embodiments, it is understood that the present disclosure is not limited to such embodiments or structures. The present disclosure encompasses various modifications and variations within the scope of equivalents. In addition, while the various elements are shown in various combinations and configurations, which are exemplary, other combinations and configurations, including more, less or only a single element, are also within the spirit and scope of the present disclosure.

For example, in each of the embodiments described above, the exemplary configuration in which the N-type is the first conductivity type and the P-type is the second conductivity type is described. Alternatively, the first conductivity type may be the P-type and the second conductivity type may be the N-type.

In each of the embodiments described above, the semiconductor device may be a planar semiconductor device in which the gate electrode 15 is arranged on the first surface 10a of the semiconductor substrate 10, instead of the trench gate type semiconductor device.

In each of the embodiments described above, the configuration of the FWD region 1b on the first surface 10a side of the semiconductor substrate 10 can be changed as appropriate. For example, an N-type region or the like corresponding to the emitter region 16 may be formed on the first surface 10a side of the semiconductor substrate 10 in the FWD region 1b.

In the first and third embodiments described above, the cathode layer 22 may be connected to the FS layer 20 at the part exposed from the extension portion 21a. The connection region 23 may have a higher carrier concentration than the cathode layer 22. Also in such a semiconductor device, the cathode layer 22 is configured to have the part exposed from the extension portion 21a, thereby suppressing the snapback of the IGBT element and suppressing the increase in the forward voltage of the FWD element.

The embodiments described above can be appropriately combined. For example, the second embodiment may be combined with the third embodiment so that the maximum peak position P1 of the collector layer 21 is closer to the drift layer 11 than the center C1.

What is claimed is:

1. A semiconductor device comprising:
a semiconductor substrate having an insulated gate bipolar transistor (IGBT) region including an IGBT element and a free wheel diode (FWD) region including a FWD element, the semiconductor substrate including:
a drift layer of a first conductivity type;
a base layer of a second conductivity type disposed on the drift layer;
a collector layer of the second conductivity type disposed opposite to the base layer with respect to the drift layer in the IGBT region; and
a cathode layer of the first conductivity type disposed opposite to the base layer with respect to the drift layer in the FWD region, and
the semiconductor substrate having a first surface adjacent to the base layer and a second surface adjacent to the collector layer and the cathode layer;
an emitter region of the first conductivity type disposed in a surface layer portion of the base layer in the IGBT region;
a gate insulating film disposed in a portion of the base layer between the drift layer and the emitter region in the IGBT region;
a gate electrode disposed on the gate insulating film;
a first electrode disposed adjacent to the first surface of the semiconductor substrate, the first electrode electrically connected to the base layer and the emitter region; and
a second electrode disposed adjacent to the second surface of the semiconductor substrate, the second electrode electrically connected to the collector layer and the cathode layer,
wherein
the collector layer includes an extension portion that entirely covers the cathode layer on a side adjacent to the drift layer, and
the extension portion has an area density of carriers being $3.5 \times 10^{12}$ cm$^{-2}$ or less.

2. The semiconductor device according to claim 1, wherein
the collector layer has a maximum peak position at which a carrier concentration is maximum at a location closer to the drift layer than a center of the collector layer in a depth direction orthogonal to the second surface of the semiconductor substrate.

* * * * *